United States Patent [19]
Gal

[11] Patent Number: 5,482,800
[45] Date of Patent: Jan. 9, 1996

[54] EXPOSURE MASK FOR FABRICATING MICROLENSES

[75] Inventor: George Gal, Palo Alto, Calif.

[73] Assignee: Lockheed Missiles & Space Company, Inc., Sunnyvale, Calif.

[21] Appl. No.: 115,888

[22] Filed: Sep. 1, 1993

Related U.S. Application Data

[62] Division of Ser. No. 982,514, Nov. 27, 1992, Pat. No. 5,310,623.

[51] Int. Cl.⁶ .................................................. G03F 1/14
[52] U.S. Cl. ................................................ 430/5; 430/321
[58] Field of Search ................................. 430/5, 9, 321; 359/642, 720

[56] References Cited

U.S. PATENT DOCUMENTS

| | | | |
|---|---|---|---|
| 3,932,184 | 1/1976 | Cohen et al. | 96/38.3 |
| 4,200,794 | 4/1980 | Newberry et al. | 250/396 ML |
| 4,279,690 | 7/1981 | Dierschke | 156/649 |
| 4,421,398 | 12/1983 | Suzuki et al. | 354/200 |
| 4,427,265 | 1/1984 | Suzuki et al. | 350/321 |
| 4,691,993 | 9/1987 | Porter et al. | 350/105 |
| 4,775,967 | 10/1988 | Shimada et al. | 369/45 |
| 4,861,140 | 8/1989 | Lucitte et al. | 350/320 |
| 4,877,717 | 10/1989 | Suzuki et al. | 430/321 |
| 4,902,899 | 2/1990 | Lin et al. | 430/5 |
| 4,983,040 | 1/1991 | Chu et al. | 356/338 |
| 4,986,633 | 1/1991 | Ohta | 350/167 |
| 5,136,164 | 8/1992 | Hendrick | 250/353 |
| 5,139,609 | 8/1992 | Fields et al. | 156/643 |

FOREIGN PATENT DOCUMENTS

| | | | |
|---|---|---|---|
| 0532040 | 3/1993 | European Pat. Off. | 430/5 |
| 3-191348 | 8/1991 | Japan | 430/5 |
| 2179472A | 3/1987 | United Kingdom . | |
| 89/06596 | 7/1989 | WIPO | 430/5 |

OTHER PUBLICATIONS

E. Hausmann & E. P. Slack, PHYSICS (3rd Edition 1948) pp. 727–728.

G. Artzner "Aspherical surfaces engraved on photoresist coating: manufacture of a zonal corrector plate for an aberrating cassegrainian telescope", 1987, *Optical Components and Systems* SPIE, vol. 805.

Osamu Wada, "Ion–Beam Etching of InP and its application to the fabrication of high radiance InGaAsP/InP light emitting diodes" vol. 131, No. 10, pp. 2373–2379, *J. Electrochem Soc.: Solid–State Science & Technology*.

W. Goltsos & M. Holz "Agile Beam Steering Using Binary Optics Microlens Arrays", Nov. 1990, *Optical Engineering*, vol. 29, No. 11.

*Primary Examiner*—Charles L. Bowers, Jr.
*Assistant Examiner*—John A. McPherson
*Attorney, Agent, or Firm*—Donald C. Feix

[57] ABSTRACT

A microlens of any designed configuration is formed as a replica in a photoresist material, and the photoresist material replica is used to reproduce the replica directly in a substrate material.

2 Claims, 10 Drawing Sheets

FIG_1
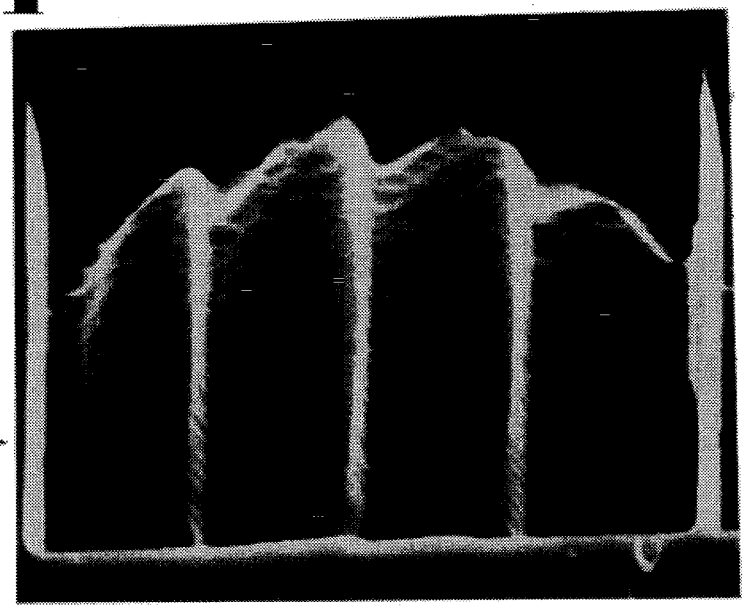
FIG_2
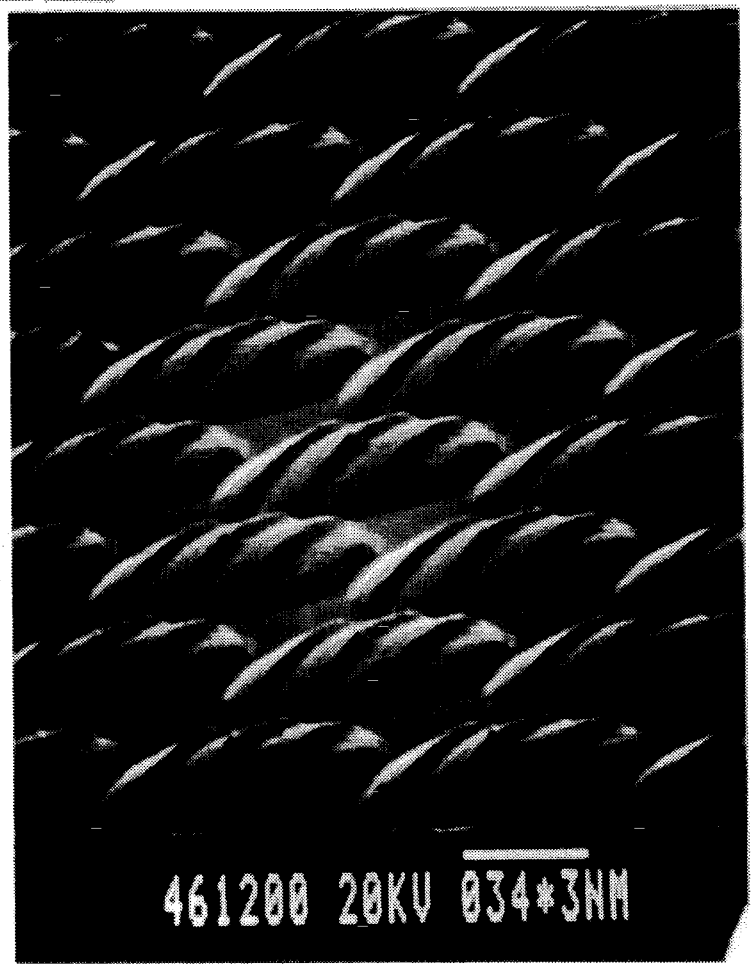

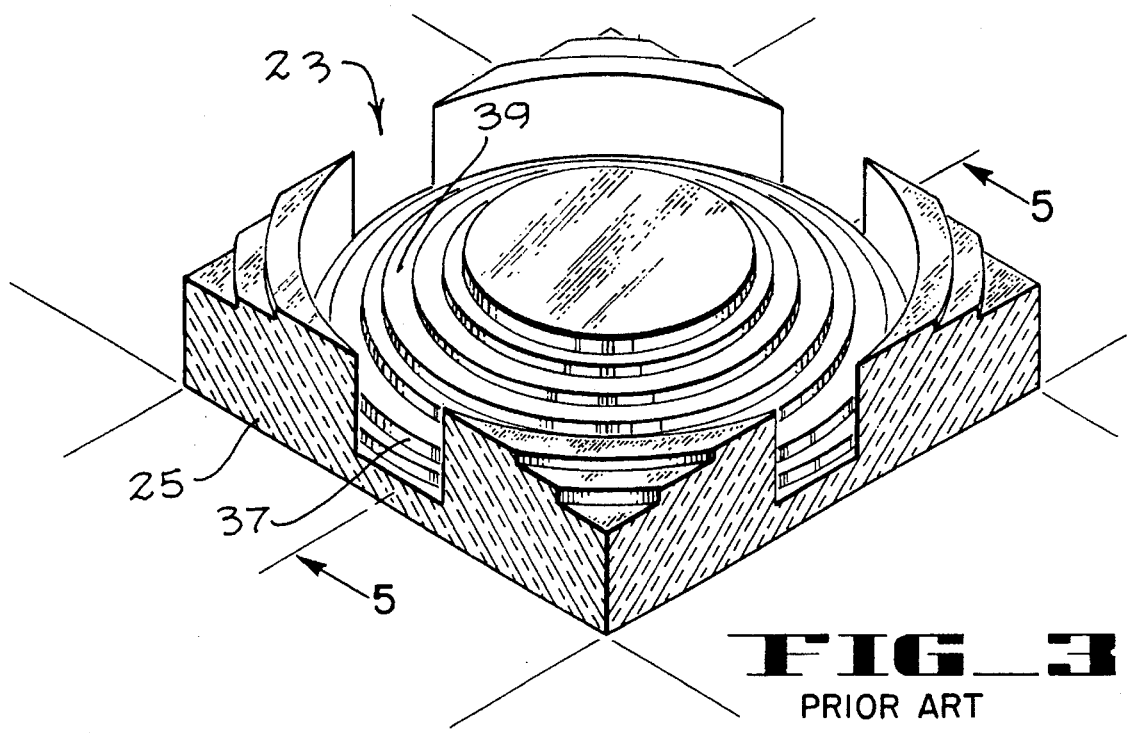
FIG_3
PRIOR ART
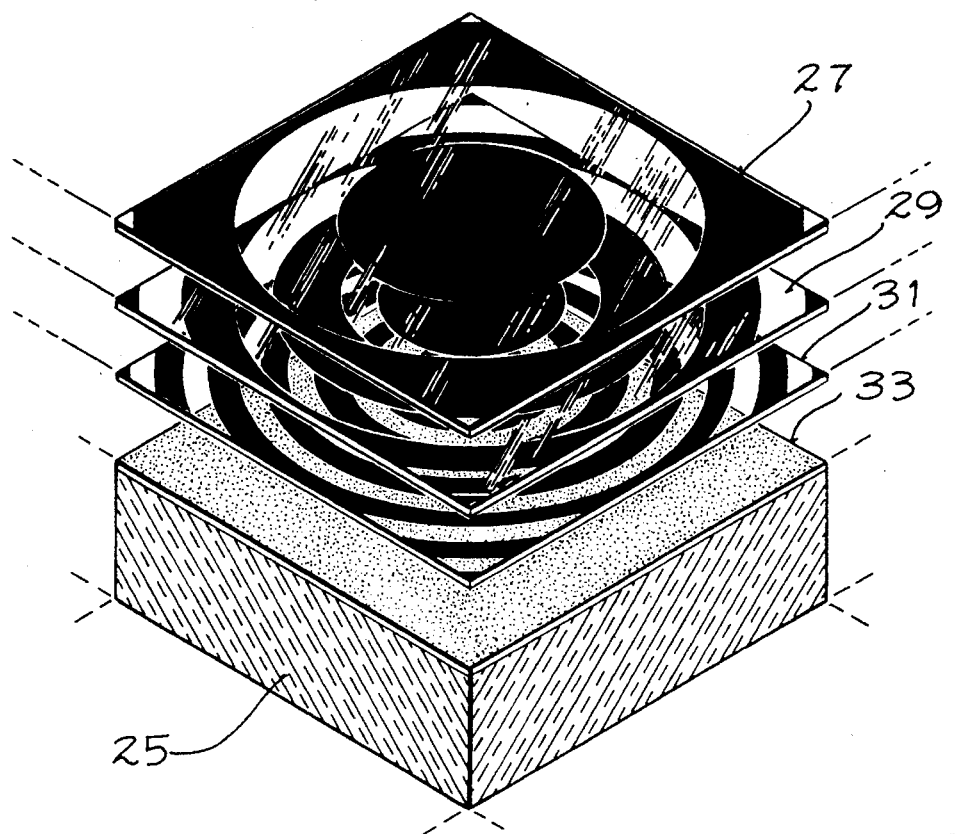
FIG_4
PRIOR ART

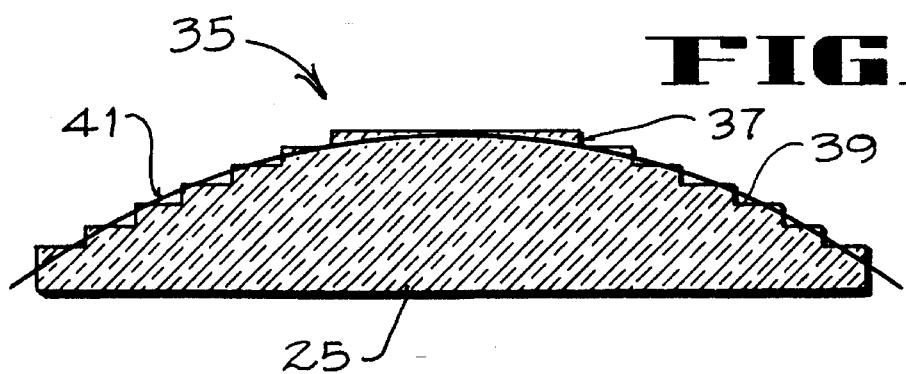
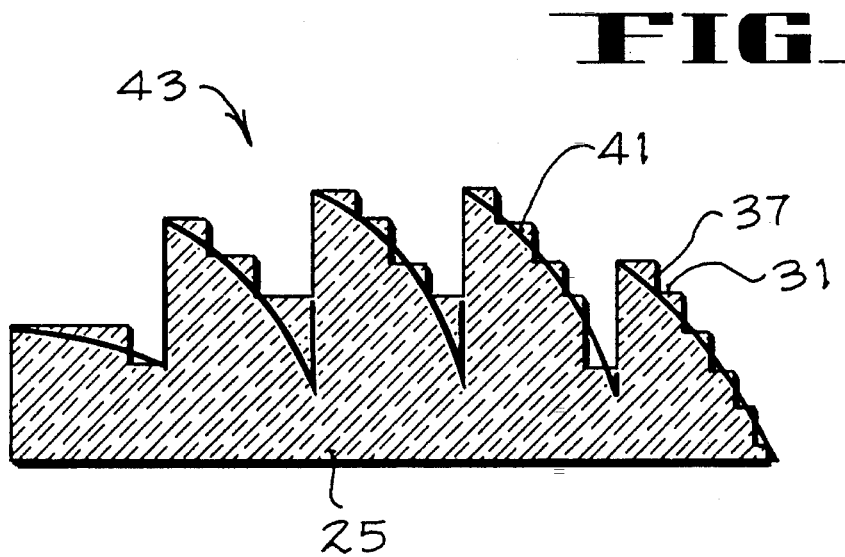

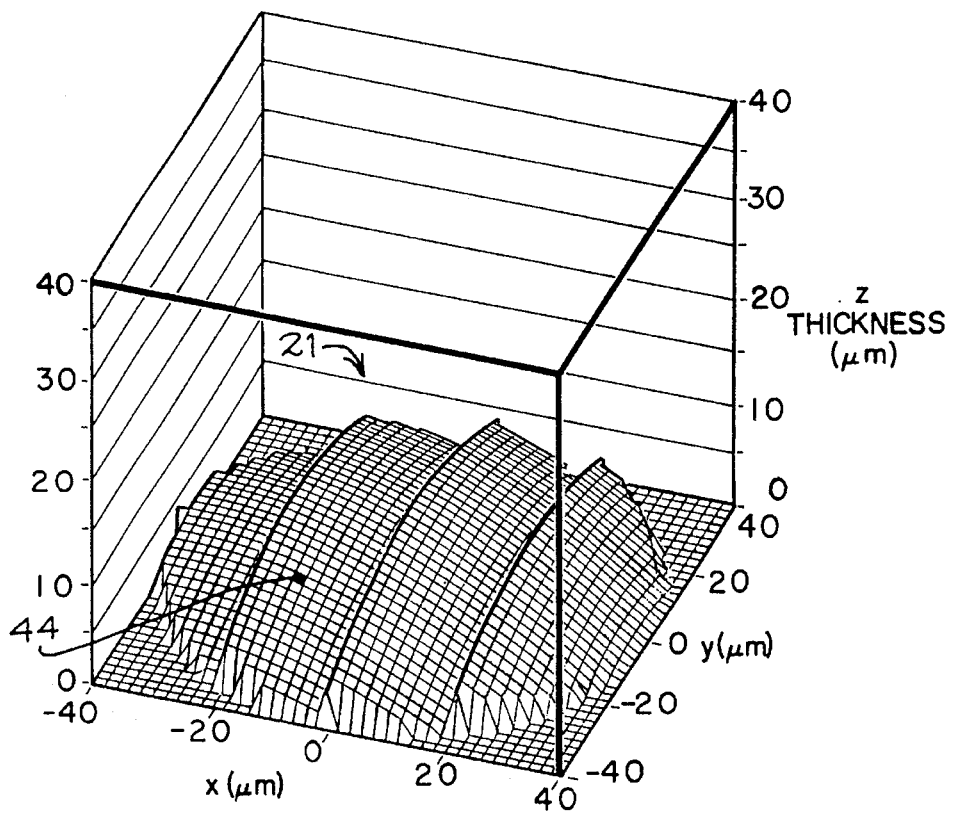
FIG_7
FIG_8
```
X=-16.0    .00    .00   3.47   3.87   4.24   4.59   4.92   5.23
          5.51   5.77   6.01   6.23   6.42   6.59   6.74   6.86
          6.96   7.04   7.10   7.13   7.14   7.13   7.10   7.04
          6.96   6.86   6.74   6.59   6.42   6.23   6.01   5.77
          5.51   5.23   4.92   4.59   4.24   3.87   3.47    .00
           .00              44
X=-14.0    .00    .00   3.23   3.62   4.00   4.35   4.68   4.98
          5.27   5.53   5.76   5.98   6.17   6.34   6.49   6.61
          6.72   6.80   6.85   6.89   6.90   6.89   6.85   6.80
          6.72   6.61   6.49   6.34   6.17   5.98   5.76   5.53
          5.27   4.98   4.68   4.35   4.00   3.62   3.23    .00
           .00
X= 12.0    .00   2.54   2.96   3.35   3.73   4.08   4.41   4.71
          5.00   5.26   5.49   5.71   5.90   6.07   6.22   6.34
          6.45   6.53   6.58   6.60   6.63   6.62   6.58   6.53
```

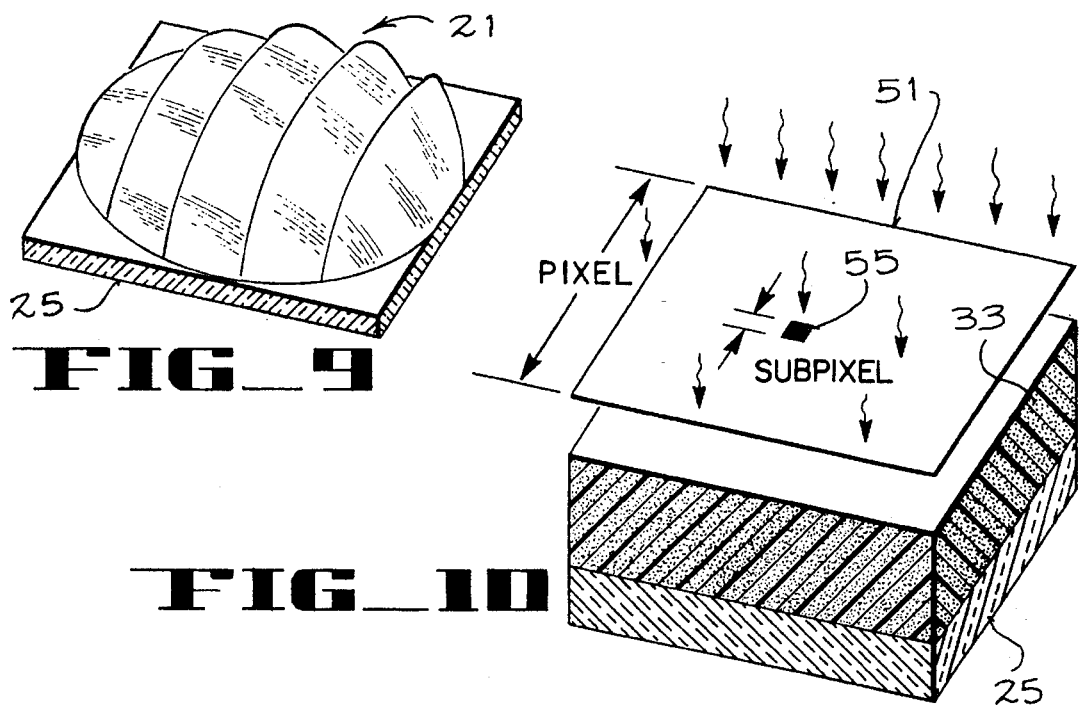
FIG_9
FIG_10
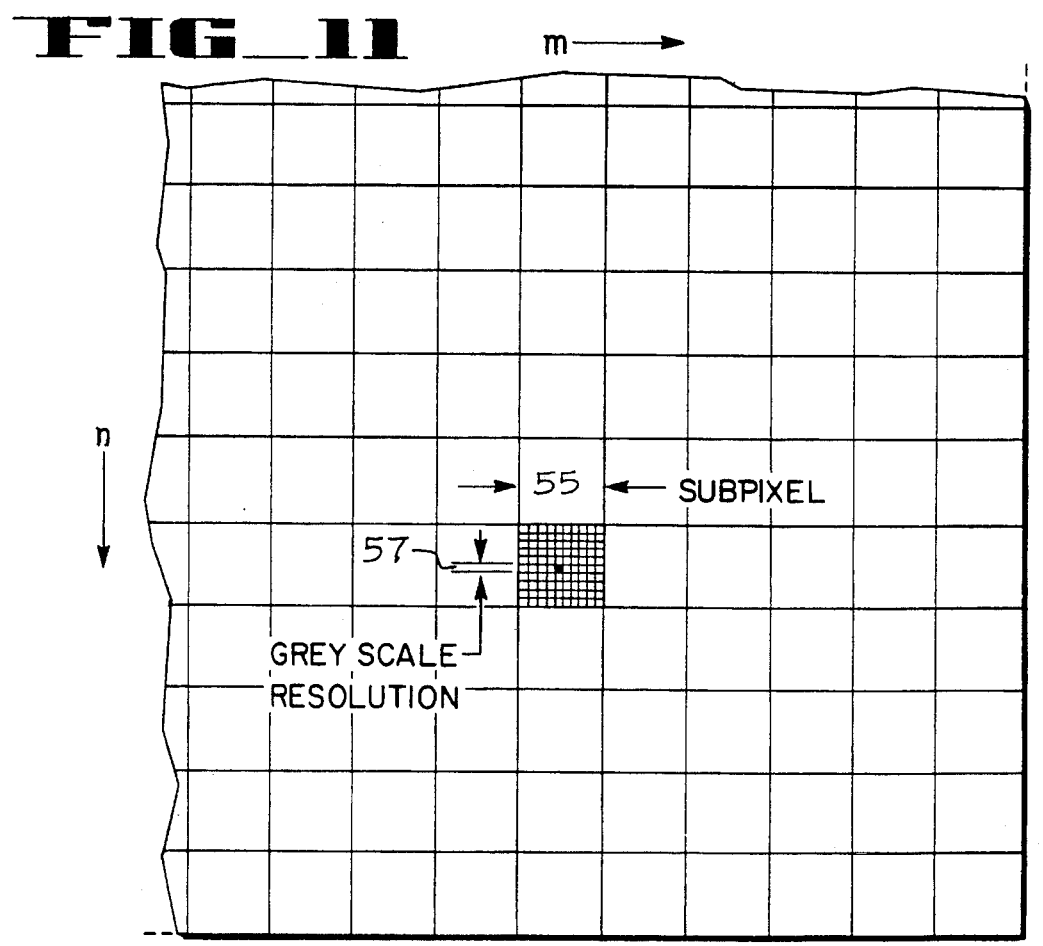
FIG_11

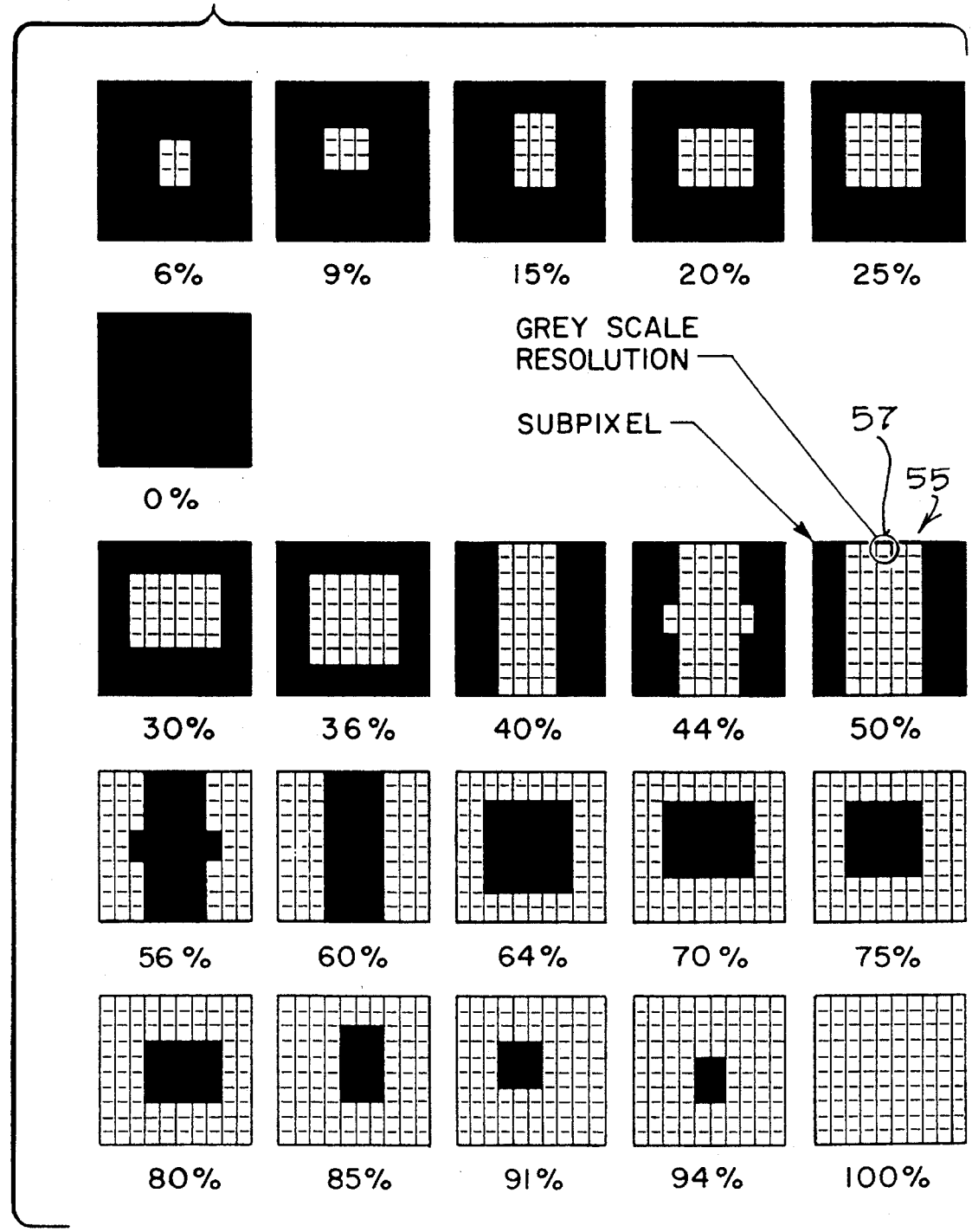
FIG_12

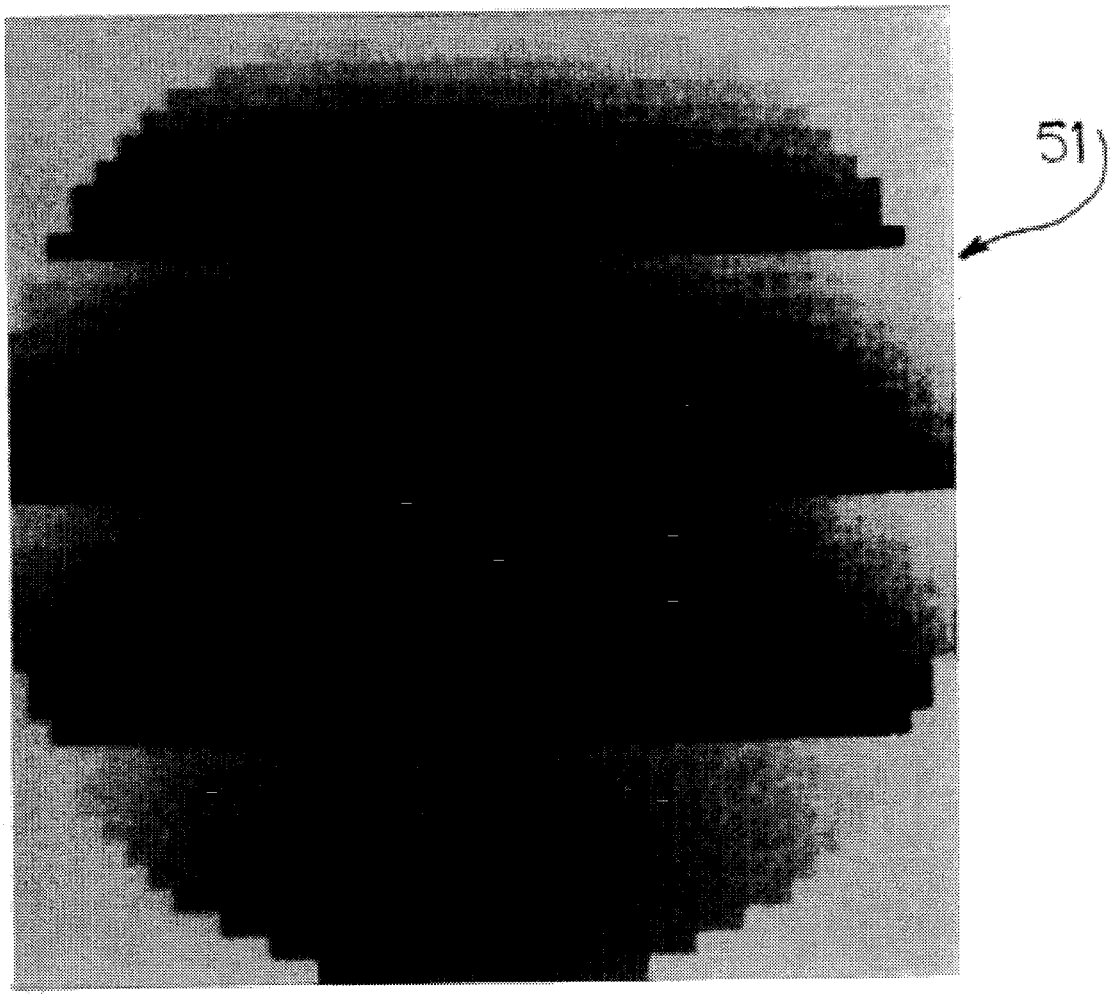
FIG_13

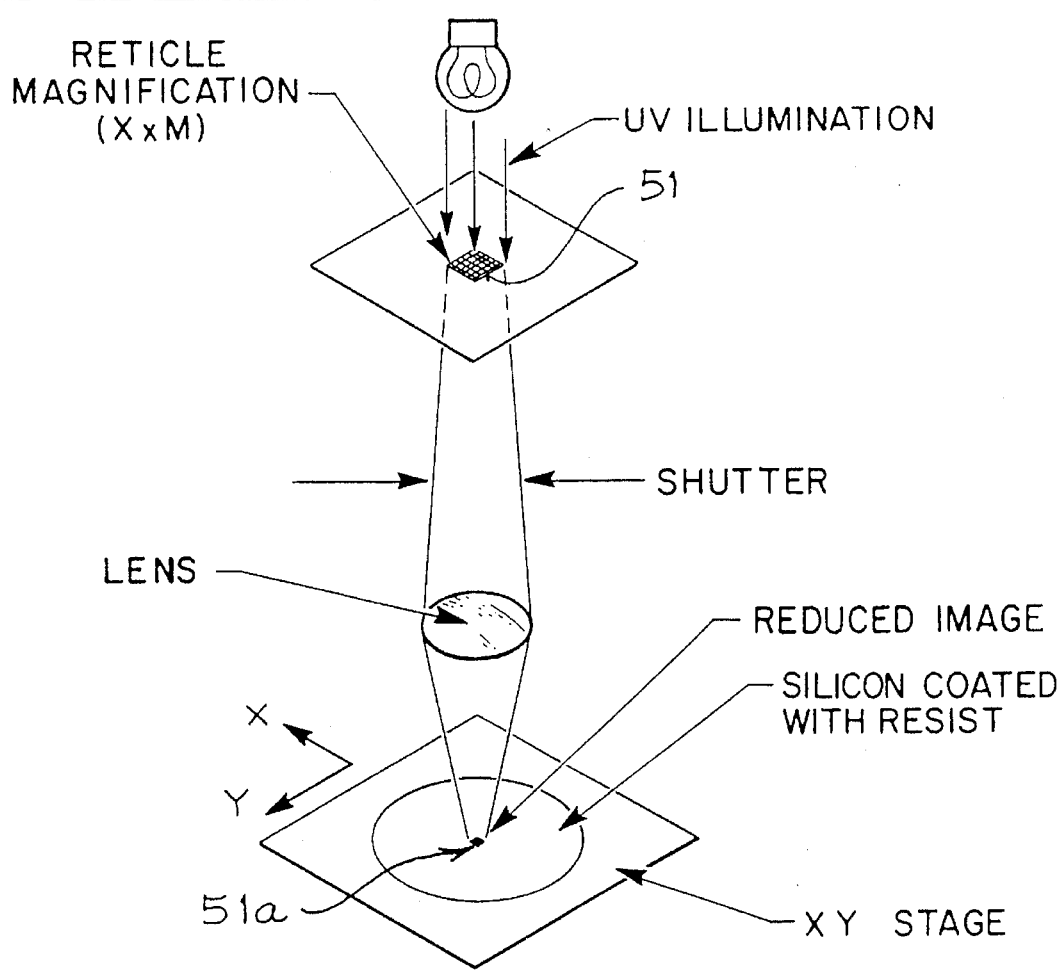
FIG_14

FIG_15
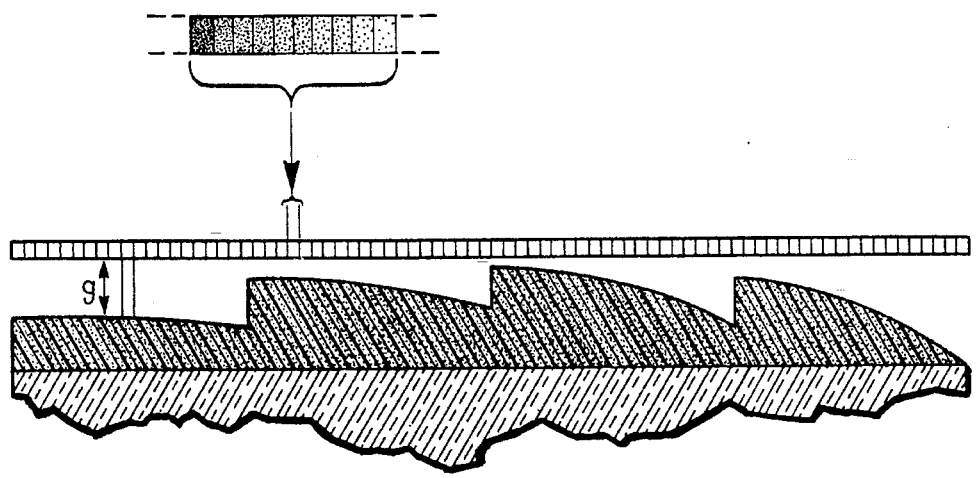
FIG_16
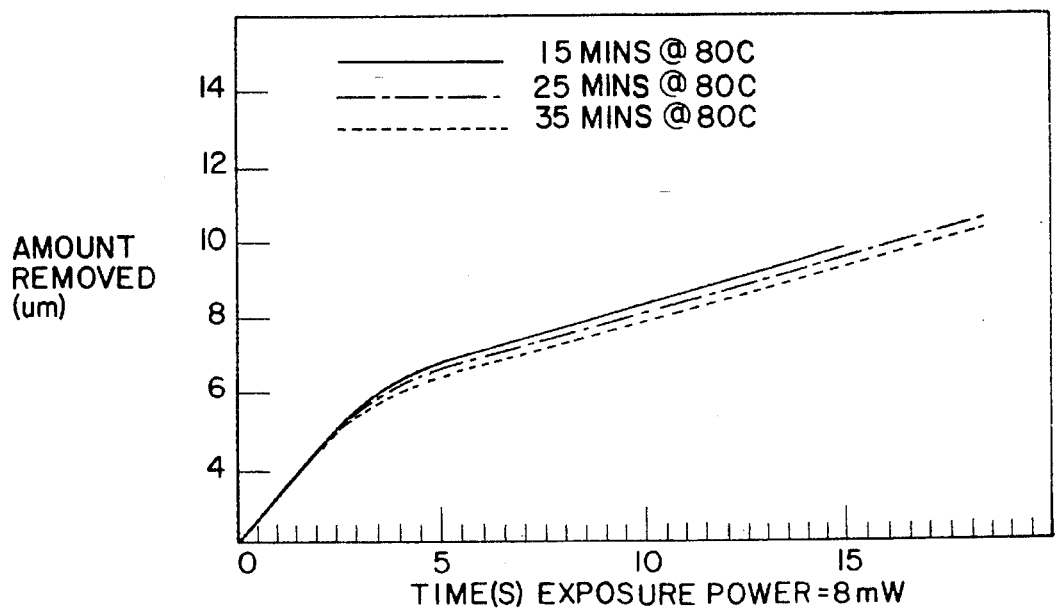

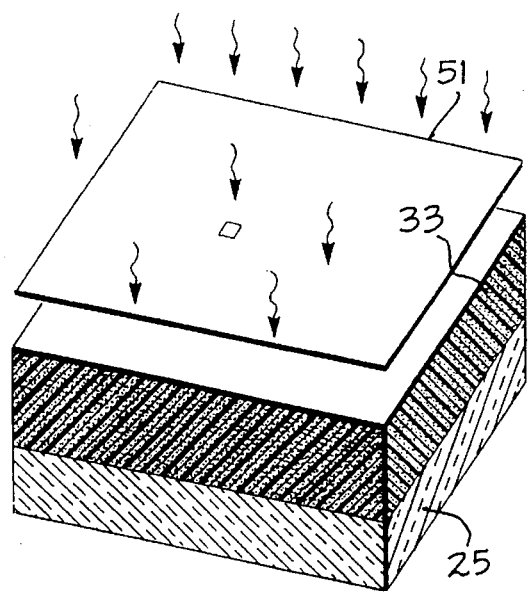
FIG_17
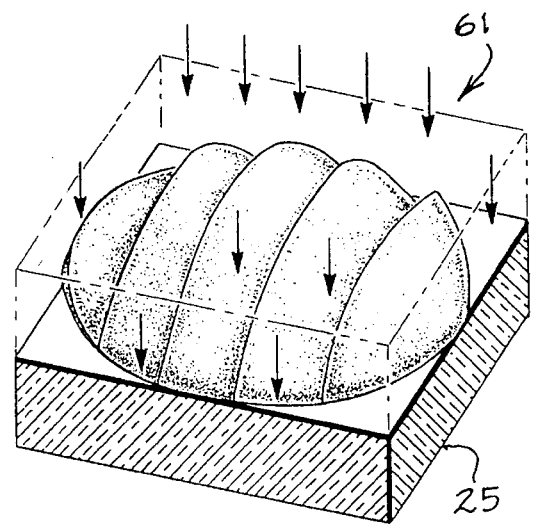
FIG_18
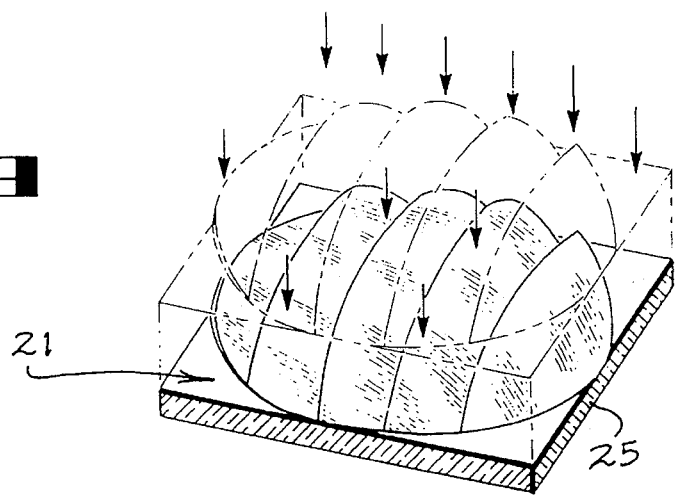
FIG_19

EXPOSURE MASK FOR FABRICATING MICROLENSES

The Government has rights in this invention pursuant to Contract DASG60-90-0012 awarded by the Department of the Army. This is a divisional of application Ser. No. 07/982,514 filed on Nov. 27, 1992, now U.S. Pat. No. 5,310,623.

BACKGROUND OF THE INVENTION

This invention relates to methods and apparatus for fabricating microlenses.

Individual microlenses fabricated in accordance with the present invention may typically range in size from a diameter of 50 microns to 1 millimeter.

Binary fabrication processes have been used to fabricating microlenses in the prior art.

A series of masks, masking steps, exposure steps and etching steps are used in binary fabrication.

In conventional binary fabrication a photoresist is applied on top of a substrate, and a series of masks are used in sequence to produce the final microlens configuration. The process involves applying a mask, exposing the photoresist through the mask, developing the photoresist, and then etching the exposed substrate. This sequence of operations is repeated for a second mask. It is usually necessary to repeat this masking, exposing, developing, etching sequence three or more times in order to obtain a microlens having the desired optical performance.

Maintaining the required registration of the masks during the successive masking, exposing, developing and etching sequences can be a problem.

Producing complex microlens designs can become difficult using binary fabrication.

Some lens designs cannot be fabricated by binary fabrication techniques.

SUMMARY OF THE INVENTION

The method and apparatus of the present invention permit a microlens of any designed configuration to be fabricated.

The method and apparatus of the present invention use only a single exposure mask.

In the present invention a replica of the designed microlens is produced in a photoresist material with a gray scale mask, and the replica is subsequently used for producing the designed microlens in a substrate material, In the present invention an exposure mask is constructed with a plurality of precisely located and sized light transmitting openings. The openings are formed with sufficiently small specific opening sizes and are located at a sufficiently large number of specific locations, which locations are correlated to related locations on the configuration of the designed microlens, to enable a replica image of the designed microlens to be produced in a photoresist material.

The replica image is produced by exposing the photoresist material to light through a gray scale mask, of a selected wavelength (usually ultra violet), transmitted through the openings in the exposure mask for a selected duration of time. The exposed photoresist material is then processed to produce a replica in the photoresist material of the designed microlens. This replica is subsequently used for producing the designed microlens in a substrate materia by differential ion milling.

In a specific embodiment of the present invention the photoresist material replica is placed on a substrate material, and ion milling is used to reproduce the replica directly in the substrate material utilizing differential ion milling for the particular substrate.

Microlens fabrication methods and apparatus which incorporate the features described above and which are effective to function as described above constitute specific objects of the present invention.

Other and further objects of the present invention will be apparent from the following description and claims and are illustrated in the accompanying drawings, which by way of illustration, show preferred embodiments of the present invention and the principles thereof and what are now considered to be the best modes contemplated for applying these principles. Other embodiments of the invention embodying the same or equivalent principles may be used and structural changes may be made as desired by those skilled in the art without departing from the present invention and the purview of the appended claims.

BRIEF DESCRIPTION OF THE DRAWING VIEWS

FIG. 1 is a photograph, greatly enlarged, of a dispersive microlens having a single valued asymmetric surface fabricated by the gray scale, single exposure mask, microlens fabrication method and apparatus of the present invention.

FIG. 2 is a photograph, greatly enlarged, of an array of identical dispersive microlenses (like the dispersive microlens shown in FIG. 1) fabricated by the gray scale, single exposure mask, microlens fabrication method and apparatus of the present invention.

FIG. 3 is an isometric view of a wideband microlens fabricated by a binary, multiple masking steps, multiple etching steps, fabrication process used in the prior art.

FIG. 4 is an isometric view showing how three separate binary masks are used in three separate exposure and etching steps used in the prior art to produce the binary fabricated wideband microlens shown in FIG. 3.

FIG. 5 is an elevation view, in cross section, taken generally along the line and in the direction indicated by the arrows 5—5 in FIG. 3, showing how the prior art, binary fabricated lens has a series of distinct step surface contours formed by flat surfaces 39 and vertical surfaces 37. In FIG. 5 the smooth surface configuration indicated by the reference numeral 41 indicates how this same microlens can be formed with a substantially smooth surface contour when the microlens is fabricated by the gray scale, single exposure mask, microlens fabricating method and apparatus of the present invention.

FIG. 6 is a view in cross section through a dispersive microlens. FIG. 6 shows how the dispersive microlens has distinct step surface contours formed by flat surfaces 39 and vertical surfaces 37 when fabricated in accordance with prior art binary, multiple masking steps and multiple etching steps fabrication. FIG. 6 shows how the microlens has substantially smooth surface contours 41 when fabricated by the gray scale, single exposure mask, microlens fabrication method and apparatus of the present invention.

FIG. 7 is an isometric view showing how a dispersive microlens is designed to have any desired configuration, as represented by the microlens 21 shown within the three dimensional plot. The three dimensional plot includes a fine two dimensional length and width grid to provide a fine resolution of the height of the lens surface at each grid line intersection. This also provides a fine gradation of the information on the change of configuration in the surface of the microlens. That fine gradation of information enables a smooth surface to be produced on the fabricated microlens.

FIG. 8 is a table listing the height of the lens surfaces at the various grid line intersections shown in FIG. 7. The values of the table shown in FIG. 8 are used in conjunction with a calibration curve shown in FIG. 16. The calibrated values are then used to determine the mask opening size which will pass the proper light intensity at each location corresponding to a related grid line intersection. The proper light intensity at each location produces a thickness of cured photoresist material which replicates the height of designed microlens at that location. This will be described in greater detail in the description below.

FIG. 9 is an isometric view (showing the designed microlens illustrated in FIG. 7) as finally fabricated in a substrate material, using the gray scale, single exposure mask, microlens fabricating method and apparatus of the present invention, FIG. 9 is a drawing view of the dispersive microlens shown in the FIG. 1 photograph.

FIG. 10 is an isometric view showing how an exposure mask is positioned above a layer of photoresist, which in turn is positioned on a substrate material in accordance with the present invention. In FIG. 10 the exposure mask is shown as a single pixel mask which is used to produce a single microlens.

FIG. 11 is a fragmentary plan view of a portion of the single pixel exposure mask 51 shown in FIG. 10. FIG. 11 shows how the single pixel exposure mask is subdivided into subpixels and also shows how each subpixel is in turn further subdivided into gray scale resolution elements 57.

FIG. 12 is a plan view showing a number of subpixels of the exposure mask. FIG. 12 shows how a subpixel may have no opening at all to provide zero transmission of the exposure light through the pixel. FIG. 12 shows how the subpixels may be formed with progressively larger openings to transmit progressively greater percentages of exposure light through the subpixels. FIG. 12 also illustrates how each opening in a subpixel is formed as a multiple of a single gray scale resolution element.

FIG. 13 is a photograph, in plan, of a single pixel exposure mask used to fabricate the dispersive microlens having a single valued asymmetric surface with step function discontinuities (forming the diffraction grating of the dispersive microlens) shown in FIG. 1 and in FIG. 9. The single pixel exposure mask shown in FIG. 13 will be referred to as a reticle in the description which follows.

FIG. 14 is an isometric view illustrating how an optical system may be used to replicate a single reticle into a staged array by a series of exposures and by moving the XY stage in increments in the X and Y directions between exposures. FIG. 14 also illustrates how the optical system may be used to photoreduce the size of the reticle. The optical system of FIG. 14 may also be used to photoenlarge the size of the reticle, either as a single reticle replication or in the course of making a staged array of enlarged reticles.

FIG. 15 is a fragmentary side elevation view, in cross section, showing how, in accordance with the present invention, a replica of the designed microlens is formed in photoresist material at an intermediate stage of fabrication of the designed microlens in the substrate material. FIG. 15 also shows how a subpixel is comprised of a gray scale resolution provided by the number of resolution elements contained within the size of the exposure opening in the particular subpixel.

FIG. 16 is a curve showing how the size of the opening in a subpixel is calibrated with respect to process parameters. The process parameters may include variations in the exposure time (shown in FIG. 16), the wavelength of the exposing light and the characteristics of the photoresist material. The calibration helps to insure that the size of the exposure opening in each subpixel transmits enough light intensity to produce the desired replication (first in the photoresist material and ultimately in the substrate material) of the height of the designed microlens at the location corresponding to that particular subpixel.

FIGS. 17, 18 and 19 are progressive views showing the stages, respectively, of (FIG. 17) exposure of the photoresist material through the openings in the single, gray scale exposure mask, (FIG. 18) replication of the designed microlens in the photoresist material following processing of the photoresist material after exposure, and (FIG. 19) processing (in this case differential ion milling) the photoresist material replica of the designed microlens into the substrate material to reproduce the replica directly in the substrate material.

DETAILED DESCRIPTION OF THE PREFERRED EMBODIMENTS

FIG. 1 is a photograph (greatly enlarged) of a single, dispersive, microlens 21 which was fabricated by the gray scale, single exposure mask, microlens fabrication method and apparatus of the present invention.

As can be seen by inspecting FIG. 1, the method and apparatus of the present invention produce a microlens with substantially smooth surface contours and without the distinct, step surface contours which are produced by prior art binary (multiple masking steps and multiple etching steps) fabrication processes.

The gray scale, single exposure mask, method and apparatus of the present invention enable, as will be described in more detail below, any configuration of microlens to be designed and to be fabricated.

The gray scale fabricated microlens can be wideband, dispersive, Fresnel, non-Fresnel, spherical, cylindrical, toroidal, single valued asymmetric or completely asymmetric in configuration.

In the method and apparatus of the present invention only a single exposure mask is needed.

Multiple masks, as required for conventional binary fabrication method and apparatus, are not needed for fabricating a microlens in the present invention.

In the present invention a single exposure, gray scale, mask is used to produce a replica of a designed microlens in a photoresist material.

That photoresist material replica is then used to reproduce the replica directly in a substrate material.

The single exposure mask method and apparatus of the present invention eliminate problems of misalignment of multiple masks.

Misalignment of the multiple masks (during the multiple masking and etching operations required for prior art binary fabrication) can produce defects in the fabricated microlenses.

The conventional photolithographic technique is somewhat better then 1 micron feature size. For the long wavelength applications, i.e., 10 micro wavelength applications, the conventional photolithographic technique will produce somewhat better than lambda divided by ten ($\lambda/10$) quality equivalent performance lens.

For shorter wavelength applications, i.e. 1 micron or visible 0.5 micron, ($\lambda/10$) quality performance requires X-Ray photolithography quality, which is quite expensive and time consuming, especially for non-spherical surfaces.

The present invention can readily achieve ($\lambda/10$) quality lens for microlenses operating in the infrared.

For microlens operating in the visible the present invention can readily achieve ($\lambda/3$) quality.

The present invention can reduce the time and expense involved in fabricating certain configurations of microlenses as compared to the time and expense required for binary techniques.

The present invention enables certain microlens configurations to be designed and fabricated which cannot be fabricated by binary techniques or which would be too costly to be produced by binary techniques.

For purposes of comparison with the present invention FIGS. 3 and 4 show, in summary form, how the prior art binary fabrication technique is used to produce a relatively simple wideband microlens 23 in a substrate material 25.

The first step in the prior art binary process is to use a mask 27 for exposing a layer of photoresist substrate 25. This exposed photoresist is then developed and the chemically removed, exposing the substrate for subsequent etching. The underlying exposed substrate 25 is etched or milled to the required depth.

The substrate is then recoated with photoresist for a second masking, exposing and etching step.

This masking, exposing and etching procedure is then repeated for a second mask 29.

The masking, exposing and etching procedure is then repeated again for the third mask 81 to finally obtain the relatively simple wideband binary fabricated microlens 23 shown in FIG. 3.

For a non symmetrical lens, seven or eight masks may be required.

The gray scale fabrication method and apparatus of the present invention (as summarized in the showings of drawing FIGS. 17, 18 and 19 and as will be described in more detail below) uses a single exposure mask 51 (FIG. 17), replicates a designed microlens 61 in a photoresist material 33 in a single exposure and development sequence (FIGS. 17 and 18) and reproduces the replica 61 directly in the substrate material 25 to produce the finished microlens 21 (FIGS. 18 and 19).

The binary fabrication technique can become more complex and time consuming as the complexity of the microlens increases.

Some microlens configurations are therefore not suitable for fabrication by binary techniques.

Also, some microlens configurations cannot be produced by binary fabrication techniques.

The quality of a microlens fabricated by binary techniques is dependent upon maintaining accurate registry of the various masks with respect to the substrate component 25. Misalignment can produce ridges and other defects in the fabricated microlens, and the effect on optical performance is dependent on the operating wavelength.

Microlenses fabricated by binary techniques characteristically have a series of distinct step surface contours. See FIGS. 5 and 6 in which the step surface contours are formed by the flat surfaces 39 and vertical surfaces 37.

Depending upon the relative sizes of the step surface contours, the number of masks used in fabrication, and the wavelength of the light transmitted through the fabricated microlenses, the step surface contours may degrade the optical performance of the binary fabricated microlens.

Microlenses fabricated in accordance with the present invention can be produced with substantially smooth surface configurations. These smooth surfaces are indicated by the reference numeral 41 in FIGS. 5 and 6.

Microlenses fabricated in accordance with the present invention eliminate the series of distinct step surface contours resulting from binary fabrication techniques.

Relatively smooth surface configurations can enhance the optical performance of the microlens.

The present invention enables a microlens of any configuration to be designed and fabricated.

The design, for example, may be generated by a computer using a three dimensional modeling program.

As shown in FIG. 7 a dispersive microlens 21 may be modeled and contained within a three dimensional plot having X, Y and Z coordinates as illustrated in FIG. 7.

As illustrated in FIG. 7 the X and Y coordinates are subdivided by lines into a plurality of equal size increments (40 increments of 0.2 micrometers in each coordinate direction in the specific embodiment illustrated in FIG. 7) so that the lines form a fine grid for locating precise points on the surface of the microlens 21 and for indicating the height (thickness) of the microlens at each precise point.

By way of example, the height of one corner of the darkened square indicated by the reference numeral 44 in FIG. 7 is 5.76 micrometers (as indicated by the rectangle also denoted by the reference numeral 44 in FIG. 8). The table shown in FIG. 8 lists the Z dimension (thickness or height) of the designed microlens at each point of intersection of X and Y grid lines shown in FIG. 7.

In the embodiment of the invention shown in FIGS. 7–13, the microlens 21 is formed within a single pixel 53 (see FIG. 10). Each pixel 53 is subdivided into subpixels 55. See FIG. 11. Each subpixel is subdivided into gray scale resolution elements 57. See FIG. 11.

In a specific embodiment of the present invention the pixel is 80 micrometers (microns) on each side, each subpixel is 2 microns on each side, and each gray scale resolution element 57 is 0.2 microns on each side. The exposing light is ultra violet light of 0.3 micron wavelength. The resolution elements 57 can be arranged in groups of three in alignment so as to enable a full wavelength of the ultra violet light to pass through an opening formed by three such aligned resolution elements.

The darkened square indicated by reference numeral 44 in FIG. 7 is two microns long, so that the darkened square 44 corresponds to a single subpixel 55 as shown in FIG. 11.

By using the precise subpixel location information (provided by the fine grid shown in FIG. 7) and by using the precise lens height or thickness information for that subpixel location (provided by the FIG. 7 plot and the FIG. 8 table) the size of a mask opening for that subpixel can be selected. By using an appropriate mask opening transmission pattern (as shown in FIG. 12) an exposure in a photoresist material can be created which will cause the height of the processed photoresist material to replicate the exact height of the designed microlens shown in FIG. 7.

Thus, by using a specific size mask opening in each subpixel area of a pixel mask, a pattern of light transmission can be generated through the pixel mask to create a replica image of the designed microlens in a layer of photoresist immediately below the composite mask.

The exposed photoresist material can then be processed using known photoresist processing to produce in the photoresist material a replica of the desired microlens, and this replica can be used subsequently (as will be described in more detail below with reference to FIGS. 18 and 19) for producing the desired microlens in a substrate material with the application of known differential ion milling technology.

FIG. 15 further illustrates details of how the replica image of a designed microlens is produced in a particular photoresist material in accordance with one specific embodiment of the present invention.

In this specific embodiment the processed of the photoresist material starts at the interface between the substrate 25, and the thickness of the processed photoresist relates to the intensity of light transmitted to the photoresist material through the exposure mask.

If a large amount of exposure light is transmitted through a particular mask opening to the photoresist material, then the upward extent of the processed photoresist is limited and the thickness of the replica is very thin.

If the amount of exposure light (transmitted through a particular mask opening in a particular subpixel) is small, then the height of the processed photoresist is large.

The amount of soluble photoresist removed from a particular subpixel area following exposure is indicated by the letter g in FIG. 15.

When the soluble material is removed, the replica 61 of the designed microlens is then formed in the remaining processed photoresist material as illustrated in FIG. 15.

FIG. 15 also illustrates how the size of the mask opening in each subpixel 55 provides a gray scale resolution dependent upon the number of resolution elements 57 incorporated within that mask opening. The gradation of the gray scale resolution proceeds from a very light gradation at the right hand side of the upper bar shown in FIG. 15 (when the size of the mask opening comprises only a few resolution elements) to a relatively dark gray scale gradation (when the size of the mask opening includes the maximum number of gray scale resolution elements for maximum exposure).

The experimental device shown in FIG. 1 was produced with 128 shades in the gray scale. Presently a 9000 gray scale resolution element is being used. The line produced by the 128 gray scale resolution is good enough for the long infrared regime ($\lambda \approx 10$ micron).

However, for the short infrared or visible regime the 9000 gray scale is mandatory.

FIG. 13 is a photograph, in plan, of a single pixel exposure mask or reticle 51 which is made up as a composite of the individual subpixel masks described above. The opening in each subpixel portion of the exposure mask or reticle 51 shown in FIG. 13 has the specific size needed for passing the intensity of the exposure light required to produce the desired height or thickness of the photoresist replica at that specific location. The photograph of the reticle 51 in FIG. 13 clearly shows the variation and gradation of light transmitted through the reticle for producing the structure and smooth surface configuration of the dispersive microlens 21 shown in FIG. 7.

The final step in the fabrication of the microlens in the substrate material is to use the photoresist material replica 61 (see FIG. 18) as a gray scale mask for reproducing the replica directly in the substrate material 25.

In one embodiment of the present invention (and as illustrated in FIGS. 18 and 19) the gray scale replica 61 is processed directly into the substrate 25 by known differential ion milling.

The height measurements of the designed microlens (as taken directly from the three dimensional plot illustrated in FIG. 7 and the table information illustrated in FIG. 8) need, in most cases, to be calibrated for certain processing parameters parameters involved.

Thus, as illustrated in FIG. 16, the amount of material removed from a particular photoresist material (in the processing of the photoresist material following exposure through the exposure mask) will be dependent upon the exposure power of the ultraviolet lamp used to make the exposure. The sizes of the mask openings in the various subpixel masks may therefore require some modification depending upon the specific parameters used.

Other process parameters, such as, for example, different photoresist materials, may also require some appropriate calibration of the sizes of the individual mask openings.

The fidelity of reproduction of the fabricated microlens (with respect to the designed microlens) can also usually be improved by making a number of test microlenses, inspecting the surface smoothness of each test microlens, and then making some appropriate adjustment in the size of one or more of the subpixel mask openings, until a substantially smooth curvature of all of the lens surfaces is obtained.

When that is achieved, the single pixel reticle 51 structure is finalized.

At that point the reticle 51 can be reproduced (using an optical system as illustrated in FIG. 14) to produce a two dimensional, single pixel, array.

The reticle can be replicated into the two dimensional array by making a number of exposures and by moving the XY stage in X and/or Y directions between exposures.

The reticle 51 can also be photoreduced or photoenlarged, alone or as part of a staged array.

In some cases it might be desirable to make the initial reticle somewhat oversized. This can facilitate forming the specific size openings in the subpixels. The oversize mask can then be photoreduced to produce the exact size reticle needed for contact printing at the particular wavelength of exposure light to be used.

In other cases it may be desirable to photoenlarge the reticle to enable the reticle to be used with an exposing light having wavelengths longer than the minimum size mask openings in the original reticle mask.

While I have illustrated and described the preferred embodiments of my invention, it is to be understood that these are capable of variation and modification, and I therefore do not wish to be limited to the precise details set forth, but desire to avail myself of such changes and alterations as fall within the purview of the following claims.

I claim:

1. An exposure mask constructed to produce in a photoresist material a replica of a microlens having a single valued asymmetric surface, using a single exposure mask, said exposure mask comprising, a layer of mask material which blocks transmission of light through the material, a plurality of precisely located and sized light transmitting openings in the mask material and formed with sufficiently small specific opening sizes and located at a sufficiently large number of specific locations, correlated to related locations on the single valued asymmetric surface of the microlens to be produced in a photoresist material so that, after exposure of the photoresist material to light transmitted through the openings and after processing the exposed photoresist material, photoresist material replica having the single valued asymmetric surface can be obtained and wherein the light transmitting openings are located to produce a step function discontinuity in the surface of the microlens photoresist material replica.

2. The invention defined in claim 1 wherein the step function discontinuity is a diffraction grating formed integrally in the surface of the microlens.

* * * * *